United States Patent [19]

Rodems

[11] Patent Number: 4,805,126

[45] Date of Patent: Feb. 14, 1989

[54] ELECTRONIC COMPENSATION NETWORK

[76] Inventor: James D. Rodems, P.O. Box 7, Dewitt, N.Y. 13214

[21] Appl. No.: 801,862

[22] Filed: Nov. 26, 1985

[51] Int. Cl.$^4$ .......................... G06F 11/30; H03F 3/68
[52] U.S. Cl. .......................... 364/571.01; 364/724.01; 330/51; 330/107; 333/173
[58] Field of Search .............. 364/571, 572, 176, 177, 364/825; 328/167; 333/173, 167, 18, 28 R; 330/107, 51, 124 R; 307/514, 520, 521; 318/621

[56] References Cited

U.S. PATENT DOCUMENTS

| | | | |
|---|---|---|---|
| 3,543,012 | 11/1970 | Courtney | 364/724 |
| 3,604,947 | 6/1969 | Puthuff | 307/233 |
| 3,798,560 | 3/1974 | Taylor | 328/167 |
| 3,808,486 | 4/1974 | Cuda et al. | 318/620 |
| 3,946,211 | 3/1976 | Jenkins | 235/151.1 |
| 4,009,400 | 2/1977 | Harris et al. | 307/233 A |
| 4,223,272 | 9/1980 | Feistel | 330/51 |
| 4,315,227 | 2/1982 | Fleischer et al. | 333/173 |
| 4,322,641 | 3/1982 | Packard | 307/521 |
| 4,337,427 | 6/1982 | Maudal | 318/615 |
| 4,338,530 | 7/1982 | Six et al. | 307/520 |
| 4,355,358 | 10/1982 | Clelford et al. | 364/424 |
| 4,374,335 | 2/1983 | Fukahori et al. | 307/521 |
| 4,383,228 | 5/1983 | Gaillard | 333/173 |
| 4,383,230 | 5/1983 | Manzolini | 333/214 |
| 4,413,240 | 11/1983 | Dyke | 333/17 R |
| 4,439,716 | 3/1984 | Minnich | 318/632 |
| 4,458,321 | 7/1984 | Whitney et al. | 364/513 |
| 4,468,640 | 8/1984 | Gritton | 333/166 |
| 4,496,859 | 1/1985 | Crooks | 307/520 |
| 4,498,037 | 2/1985 | Razavi | 318/561 |
| 4,574,250 | 3/1986 | Senderowicz | 330/51 |
| 4,607,231 | 8/1986 | Nakayama | 333/173 |

Primary Examiner—Parshotam S. Lall
Assistant Examiner—David Goldman
Attorney, Agent, or Firm—Shlesinger, Arkwright & Garvey

[57] ABSTRACT

An electronic compensation network which allows the analytic and empirical realization of the compensation needed to optimize a system response. The electronic compensation network includes a switched capacitor active filter network; means for selectively changing filter characteristics; and, means for indicating the characteristics of the compensator which produces an optimized system response.

11 Claims, 6 Drawing Sheets

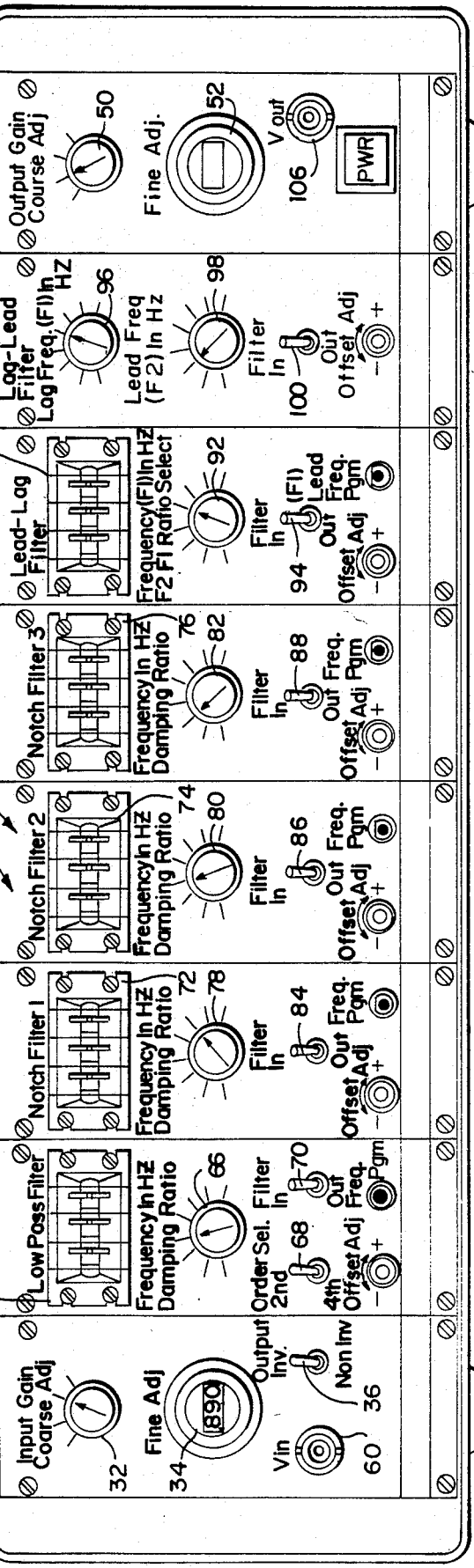

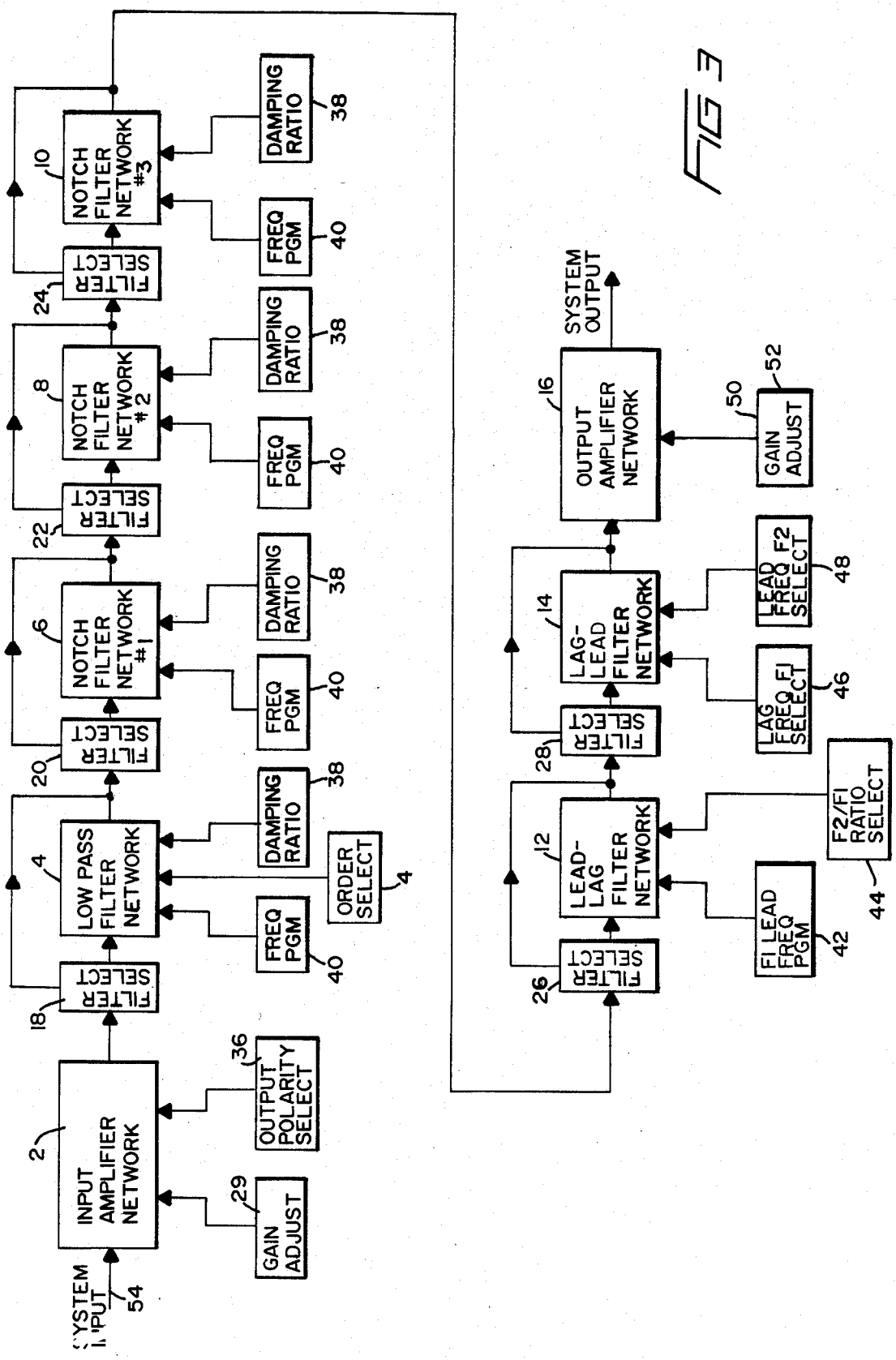

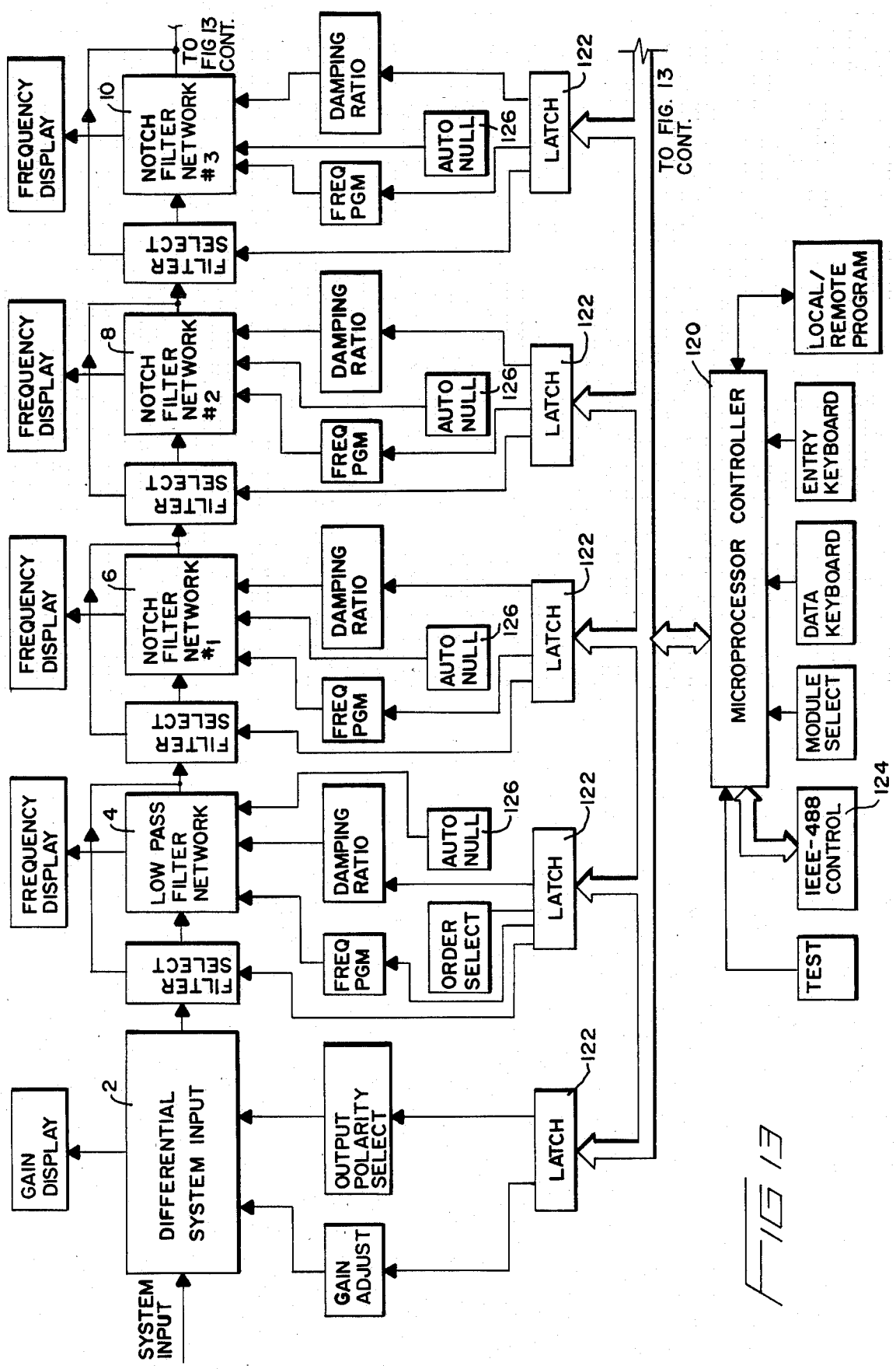

ELECTRONIC COMPENSATION NETWORK

BACKGROUND OF THE INVENTION

This invention relates to compensation networks for use with feedback control systems. More particularly, the invention relates to a method and apparatus for alteration or adjustment of a control system, by use of a compensator, to obtain optimum response in a closed feedback loop and for providing a reading of the nature of the compensator employed.

Feedback control systems, such as closed loop servo systems, are commonly used to control such things as the position and velocity of a motor. Such systems are typically defined by their system transfer function. In the case of a motor used in a device, such as a robot or the like, the internal operating parameters of the motor are elements of the system transfer function.

A process, represented by the transfer function G(s), in LaPlace transform notation, whatever its nature, is subject to a changing environment, aging, ignorance of the exact values of the process parameters, and other natural factors which affect a control process. It is not always possible to simply adjust a system parameter and thus obtain the desired performance. Instead, it is necessary to reconsider the structure of the system in order to obtain a suitable one.

In redesigning a control system, in order to alter the system response, an additional component is inserted within the structure of the feedback system. It is this additional component or device that equalizes or compensates for the performance deficiency. The compensating device may be an electric, mechanical, hydraulic, pneumatic, or other type of device or network, and is often called a compensator. Commonly, an electric circuit serves as a compensator in many control systems. The transfer function of the compensator is designated as $G_c(s) = E_{out}(s)/E_{in}(s)$ and the compensator may be placed in a suitable location within the structure of the system. Several types of compensator are shown in FIGS 1a–1d for a single loop feedback control system. The compensator placed in the feed forward path is called a cascade or series compensator. Similarly, the other compensation schemes are called feedback, output or load and input compensation, as shown in FIGS. 1(b), 1(c) and 1(d), respectively. The selection of the compensation scheme depends upon a consideration of the specifications, the power levels at various signal nodes in the system, and the networks available for use.

In the past, the designers of systems were limited in knowledge of loop component transfer functions and were forced to rely on approximate transfer functions until a feedback control system was constructed. After the control system was constructed a Bode plot (frequency response transfer function) would be obtained on the actual hardware of the system, in order to determine the small and large amplitude stability margins. At this juncture, a compensation network could be designed in an attempt to obtain desired performance. Typically, changing the performance of a system involved pulling out circuit boards and rearranging components, or replacing old circuit boards with new ones. Unfortunately, this process involves an unreasonable amount of guess work and a great deal of engineering time—as the precise changes needed are not at all apparent. Often, the theoretical compensator differs from the compensator actually needed to obtain desired performance. Further, because similar systems may require different compensation, the engineering time needed to obtain desired performance may be prohibitive.

OBJECTS AND SUMMARY OF THE INVENTION

It is an object of the present invention to provide a system which allows a designer (and user) to empirically realize the compensation needed to optimize the response of a system with vastly improved efficiency.

It is still another object of the invention to provide a system which enables a designer (and user) to rapidly obtain optimum response in a closed feedback loop.

Still another object of the present invention is to provide a system which overcomes the presence of electrical noise ad mechanical resonance in a feedback control system and indicates the compensation needed to obtain that effect.

A further object of the present invention is to provide a maintenance, laboratory, and factory test tool which is portable, lightweight and relatively small, with the ability to adjust compensation parameters for observably optimizing response to typical commands in a feedback control system and to indicate the compensation parameters used to obtain an optimized response.

Yet another object of the present invention is to provide a compensation and filter network allowing experimental adjustment of a system response to reduce noise, suppress resonances and optimize loop gain and phase margins.

Yet another object of the present invention is to provide a compensation and filter network wherein parameters of the compensation and filter network may be adjusted so that once response performance has been optimized, the compensation parameters adjusted provide a subset of the instrument required for the optimized system. In addition, this subset of filters and networks is readjustable as the system ages, parts are replaced, or the system is modified.

In summary, an electronic compensation network is provided comprising: active filter means; control means for selectively changing filter parameters; and means for indicating the characteristics of the filter which produces an optimized system response.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1(a) is a diagram of a single loop feedback control system with a series compensator.

FIG. 1(b) is a diagram of a single loop feedback control system with a feedback compensator.

FIG. 1(c) is a diagram of a single loop feedback control system with an output compensator.

FIG. 1(d) is a diagram of a single loop feedback control system with an input compensator.

FIG. 2 is a front elevational view of a compensation network unit having control means and indicator means for indicating compensation characteristics.

FIG. 3 is a system block diagram of the electronic compensation network of the present invention.

DESCRIPTION OF THE PREFERRED EMBODIMENT

In reference to FIGS. 1(a)–1(d), it is desirable to place a compensator $G_c(s)$ in a suitable position within the feedback control system. Because the nature of the compensator employed will vary from one application to another, a system which is to be used to empirically realize the compensation needed must include a wide variety of analytic functions. Various analytic functions which are desirable, alone or in combination, are shown in FIG. 4 through FIG. 10.

Figure 4:
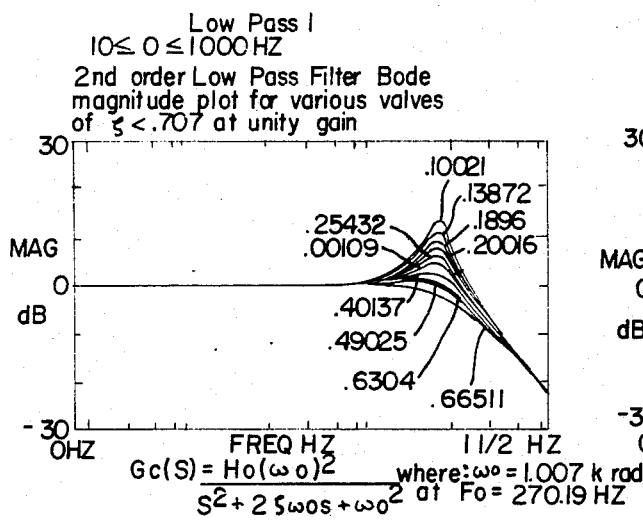
FIG. 4 is a Bode magnitude plot for various values of a damping ratio less than 0.707 at unity gain of a second order low pass filter. The transfer function for the low pass filter $G_c(s)$ is also shown in FIG. 4.
Figure 6:
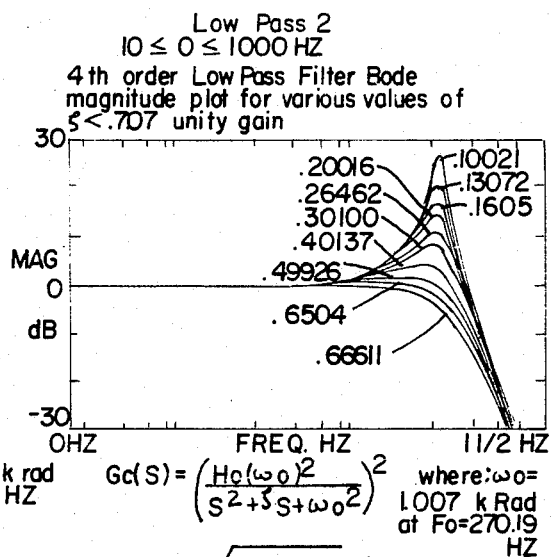
FIG. 6 is a magnitude plot for a fourth order low pass filter for various values of a damping ratio less than 0.707 at unity gain. The transfer function for the fourth order low pass filter $G_c(s)$ is also shown in FIG. 6.
Figure 5:
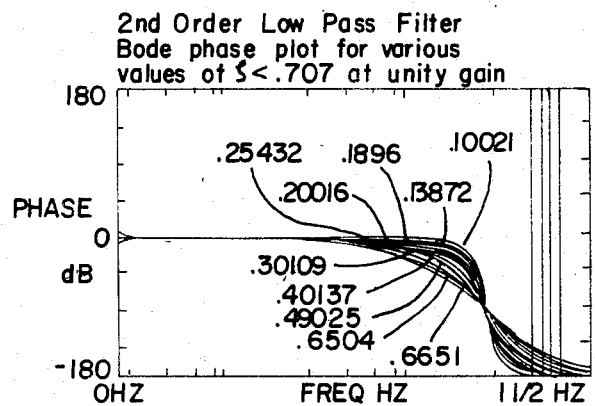
FIG. 5 is a Bode phase plot for a second order low pass filter for various values of a damping ratio less than 0.707 at unity gain.
Figure 7:
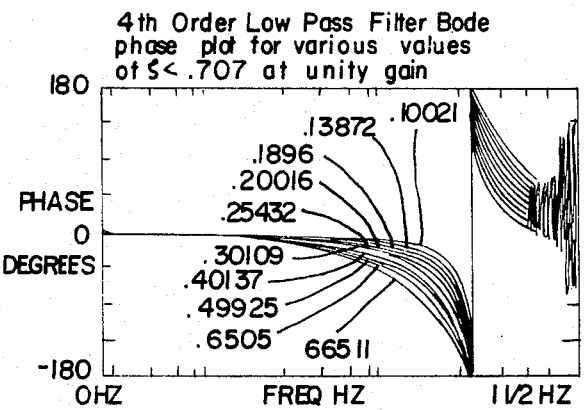
FIG. 7 is a Bode phase plot for a fourth order low pass filter for various values of a damping ratio less than 0.707 at unity gain.
Figure 8:
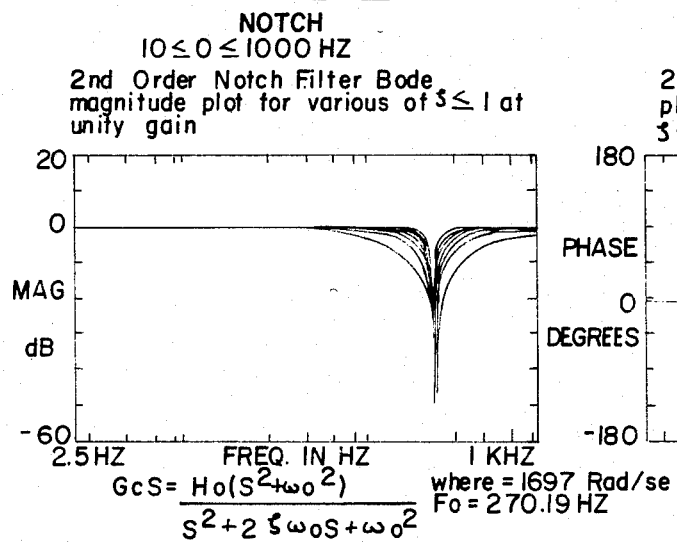
FIG. 8 is a Bode magnitude plot for a second order notch filter for various values of a damping ratio less than or equal to one at unity gain. The transfer function for the second order notch filter is also shown in FIG. 8.
Figure 9:
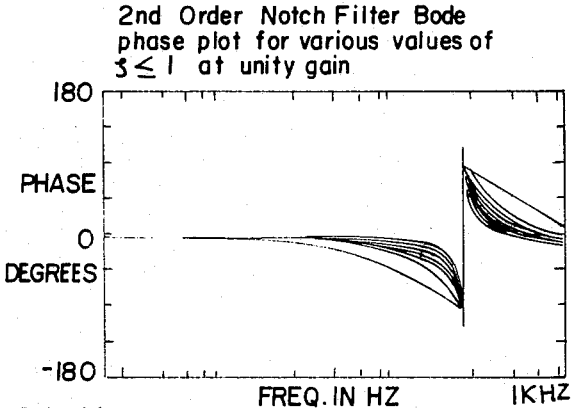
FIG. 9 is a Bode phase plot for a second order notch filter for various values of a damping ratio less than or equal to one at unity gain.
Figure 10:
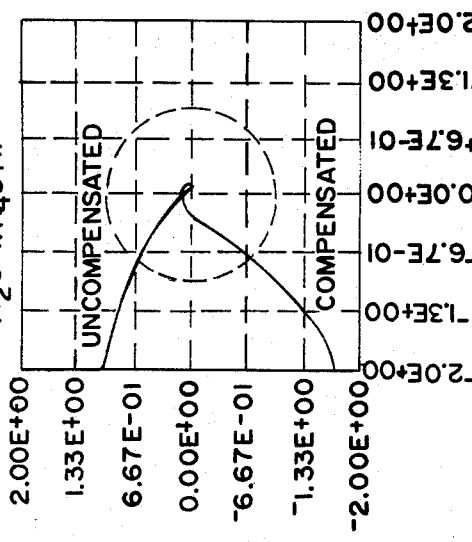
FIG. 10 is a Nyquist plot for a lag-lead stability compensation filter. The transfer function for the lag-lead filter $G_c(s)$ is also shown in FIG. 10.

Referring to FIG. 3 in particular, there is shown a system block diagram of a compensation network in accordance with the invention. Advantageously, the network is comprised of an input amplifier 2, a low pass filter network 4, capable of producing the analytic function shown in FIGS. 4 and 5 and the fourth order function of FIGS. 6 and 7, operably connected to the input amplifier network 2. A string of notch filter networks 6, 8 and 10 are interconnected and are each capable of producing the analytic function shown in FIGS. 8 and 9. The string of notch filters are operably connected to the low pass filter network 4. A lead-lag filter network 12 is operably connected to the series of notch filters 6, 8 and 10. A lag-lead filter network 14, capable of producing the compensation shown in FIG. 10, is operably connected to lead-lag filter network 12. An output amplifier 16 is operably connected to lag-lead filter network 14.

The filters are, preferably, arranged in a serial manner in such a way that each filter may be bypassed or combined with other filters to produce the desired filter characteristics. A bypass means or filter select switch 18 is advantageously provided to bypass low pass filter network 4. Similarly, notch filters 6, 8 and 10 are provided with filter select switches 20, 22 and 24, respectively. Likewise, the lead-lag filter network 12 is provided with a filter select switch 26 and lag-lead filter 14 is provided with a filter select switch 28.

The filters employed in the present invention are active filters of the metal-oxide-semiconductor (MOS) switched-capacitor type.

Active filters combine op amps and discrete transistors, primarily with resistors and capacitors, to provide impedance buffering and filter parameter tunability. The switched-capacitor filter involves a switched capacitor integrator which is a key factor in the filter design, as the integrator establishes the overall filter time constant and, therefore, its resonant frequency.

Figure 12A:
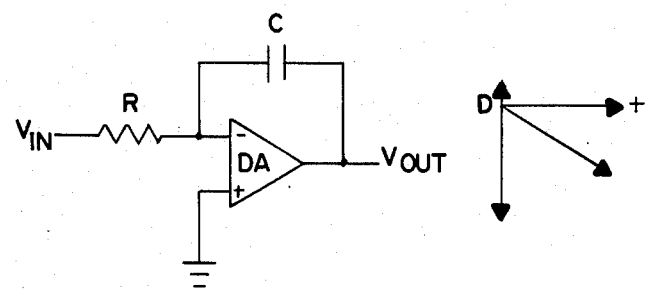
FIG. 12a is a schematic of an inverting integrator.
Figure 12B:
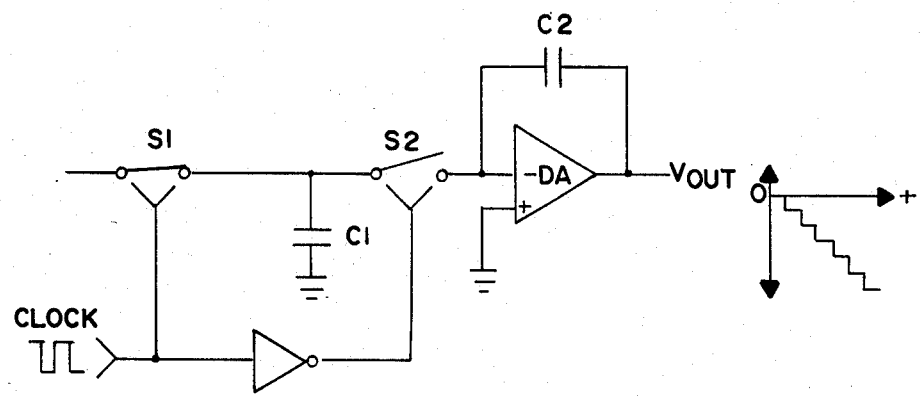
FIG. 12b is a schematic of an inverting switched capacitor integrator.

A convenient way to explain the switched capacitor integrator is to refer to the inverting integrator of FIG. 12a and realize that the input resistor R can be replaced by two switches and a capacitor as in FIG. 12b. In FIG. 12a the current which flows through feedback capacitor C is equal to $V_{in}/R$ and the circuit time constant is RC. This time constant accuracy depends on the absolute accuracy of two completely different discrete components. In FIG. 12b switches S1 and S2 are alternately closed by the clock. When switch S1 is closed, switch S2 is opened and capacitor C1 charges up to $V_{in}$. At the end of half a clock period, the charge 20 on C1 is equal to $V_{in} \times C1$. When the clock changes state, S1 opens and S2 closes. During this half of the clock period, all of the charge on C1 gets transferred to the feedback capacitor C2.

The amount of charge transferred from the input, $V_{in}$, to the summing junction (the negative input) of the op amp during the complete clock period is $V_{in}$ C1. Recall that electrical current is defined as the amount of charge that passes through a conduction path during a specific time interval (1 ampere=1 coulomb per second). For the circuit of FIG. 12b the current which flows through C2 to the output is:

$$I = \Delta Q/\Delta t = (V_{in}\ C1)/T = V_{in}\ C1\ f_{clk} = V_{in}\ C1\ f_{clk}$$

where T is equal to the clock period.

The effective resistance from $V_{in}$ to the (−) input is therefore:

$$R = V_{in}/I = 1/(C1\ f_{clk})$$

This means that S1, S2 and C1, when clocked in FIG. 12b, act the same as does the resistor in FIG. 12a to yield a clock tuneable time constant of:

$$\tau = C2/(C1\ f_{clk})$$

Note that the time constant of the switched capacitor integrator is dependent on a ratio of two capacitor values, which, when fabricated on the same die, is very easy to control both from part to part and with changes in temperature.

Figure 12C:
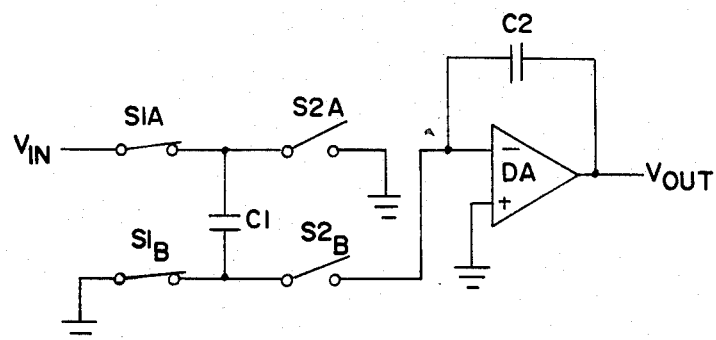
FIG. 12c is a schematic of a switched capacitor integrator utilized in the compensation network of the invention.

The actual inverters to be used in the present invention are non-inverting, requiring a slightly more elegant switching scheme, as shown in FIG. 12c. In the circuit of FIGS. 12c, S1$_a$ and S1$_b$ are closed together to charge C1 to $V_{in}$. Then S2$_A$ and S2$_B$ are closed to connect C1 to the summing junction with the capacitor plates reversed, to provide a non-inverting operation. If $V_{in}$ is positive, Vout will be more positive as C2 acquires the charge from C1.

Referring to FIG. 3, input amplifier 2 has associated therewith a gain adjust means 29 and an output polarity selection means 36. Gain adjust means 29 includes a course input gain adjustment means 32 and a fine input gain adjustment means 34, as best shown in FIG. 2. Output polarity select means 36 comprises an inverter which inverts the output of the input amplifier 2. Each of low pass filter 4, notch filter 6, notch filter 8 and notch filter 10 have associated damping ratio adjustment means 38 and frequency adjustment means 40, as best shown in FIG. 3. In this way, the frequency characteristics and the damping ratio of each of the low pass filter network 4, the notch filter network 6, the notch filter network 8 and the notch filter network 10 may be adjusted.

The low pass filter network 4 includes both a second order low pass filter network and a fourth order low pass filter network. An order select switch 42 is provided to switch between the second order low pass filter network and the fourth order low pass filter network.

Because two frequency characteristics are of importance in a lead-lag filter network, the lead-lag filter network 12 advantageously has associated therewith a first frequency adjustment means 43 to adjust a fist frequency characteristic of the lead-lag filter network 12. Additionally, a ratio select means 44 is provided. Ratio select means 44 adjusts the ratio of a second lead-lag frequency characteristic to the first lead-lag frequency characteristic which has been set by adjustment means 43.

Lag-lead filter 14 is advantageously provided with a first frequency select adjustment 46 and a second frequency select adjustment means 48. The first frequency adjust means 46 adjusts a first frequency characteristic of the lag-lead filter network 14. The second frequency adjust means 48 adjusts a second frequency characteristic of the lag-lead filter network 14.

Output amplifier means 16 includes a course gain adjustment 50 and a fine gain adjustment 52, as shown in FIG. 2. By providing a gain adjustment at the input amplifier network 2 and the output amplifier network 16, the system of the present invention allows for the adjustment of the gain of an input signal, input at system input 54, before the signal is passed through the filter networks. After the signal has passed through the filter networks, the gain may be adjusted at output amplifier 16.

By this construction, the various controls which change the characteristics of the filter used and the parameters of the filter may be varied in accordance with the feedback control system under consideration, thereby obtaining an optimum response in the closed feedback loop. The various adjustment means and selection means comprise a general control means generally designated C. The values of the parameters selected for the filter, along with other various indicia of the compensator characteristics, may be displayed by an indicator generally designated I, as best shown in FIG. 2.

Referring now to FIG. 2 in particular, there is shown one embodiment of a control means C and indicator means I contemplated by the invention. FIG. 2 shows various controls which, with associated indicators, enable a user to determine the characteristics of the compensator. For example, there is provided an input gain course adjustment knob 32, an input gain fine adjustment knob 34, a signal input connection 60 and a signal inversion means 36. Associated with the low pass filter network 4 there is a low pass frequency selector and indicator 64, a low pass damping ratio indicator and selector 66, a low pass order selector and indicator 68 and a low pass filter bypass switch and indicator 70. Each of the notch filter networks 6, 8 and 10 has associated therewith a first, second and third notch filter frequency selectors and indicators 72, 74 and 76 respectively, first notch filter, second notch filter and third notch filter damping ratio selectors and indicators 78, 80 and 82 respectively, first notch filter, second notch filter and third notch filter bypass switch and bypass indicator 84, 86 and 88 respectively. The lead-lag network 12 has associated therewith a lead-lag filter first frequency selector and indicator 90, lead-lag filter second frequency to first frequency ratio selector and indicator 92, lead-lag filter bypass switch and bypass indicator 94. Associated with the lag-lead filter network 14 there is a lag-lead filter first frequency selector and indicator 96, lag-lead filter second frequency selector and indicator 98, lag-lead filter bypass switch and indicator 100. The output gain network includes an output gain course adjustment selector and indicator 50, output gain fine selector and indicator 52 and the signal output connection 106.

As should be readily apparent to the reader, the control means C and indicator means I may be in various other forms without departing from the scope of the present invention. For example, all of the various controls shown in FIG. 2 may be in the form of a digital controller, such as a key pad or the like. Obviously, the indicator means I may relate filter parameter information and compensation characteristics to a user through known devices, such as digital computers or the like. Further, the controls of the system may be operated by a computer and the data from the indicator means I may be weighed and evaluated by a digital computer.

Figure 11:
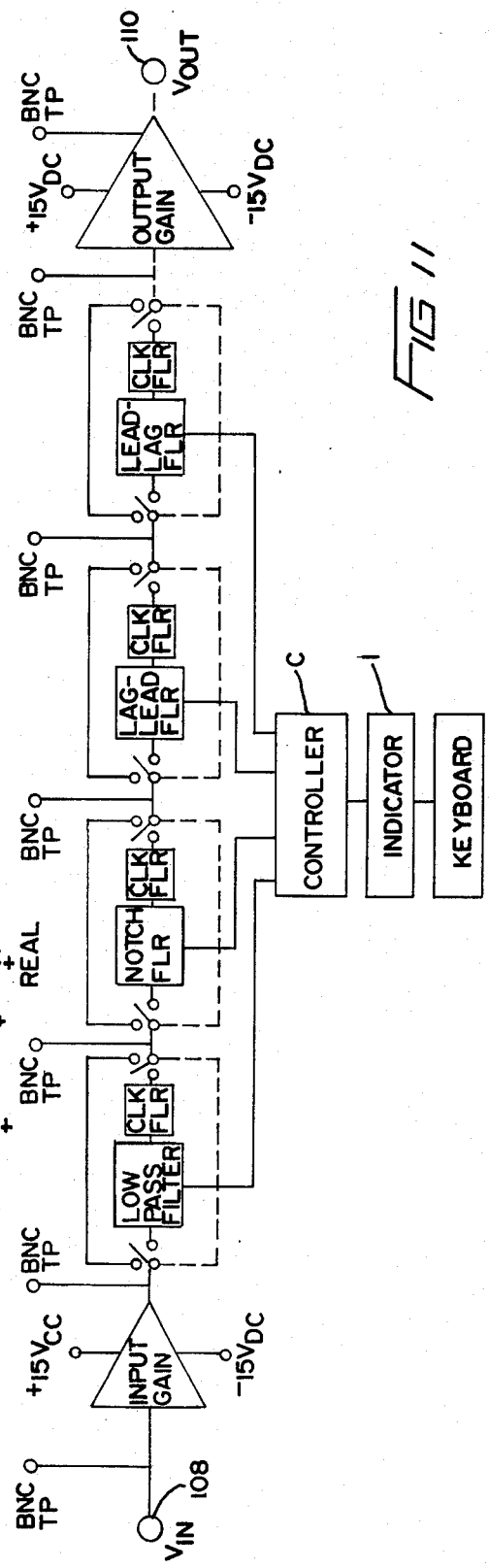
FIG. 11 is a block diagram of a compensation network unit having a digital control and a digital indicator according to the invention

Referring to FIG. 11, there is shown a second embodiment of a control means C and indicator means I, contemplated by the invention, together with a block diagram of the compensation network. In the embodiment of FIG. 11, the control means C is of a digital type and may be a keyboard or the like. Similarly, the indicator I is also of a digital type and may be a display screen or the like.

Figure 13:
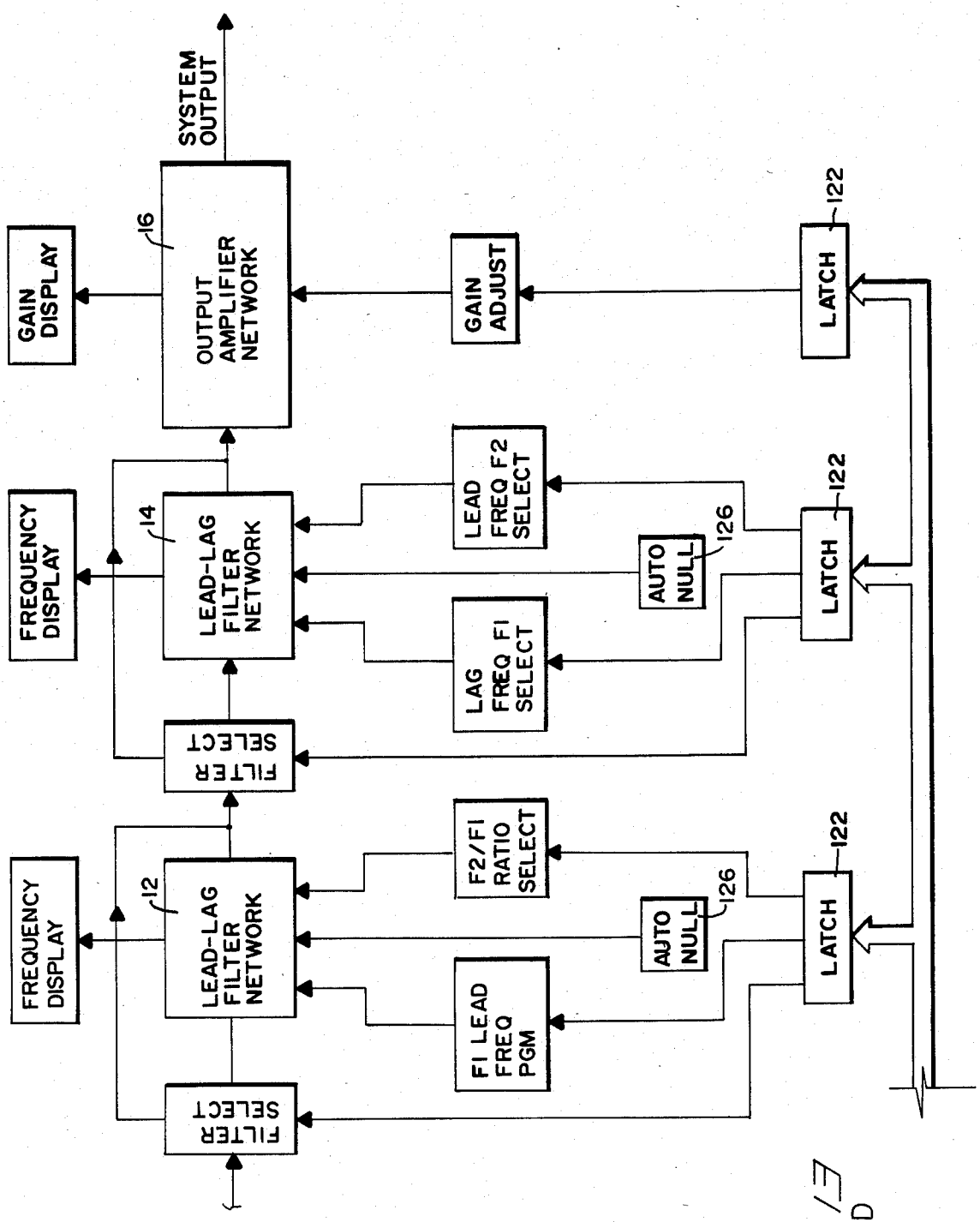
FIG. 13 is a system block diagram of the electronic compensation network of a second embodiment of the invention.

FIG. 13 illustrates the embodiment of FIG. 11 in more detail, including the interconnection of various components of the device of the second embodiment. The electronic compensation network system shown in FIG. 13 includes an input gain network 2, low pass filter network 4, notch filter networks 6, 8 and 10, lead-lag filter network 12, lag-lead filter network 14 and output gain network 16. The various filter networks and gain networks of the embodiment of FIG. 13 are substantially identical to the filter networks and gain networks described in regard to the embodiment of FIG. 3. Each of the above-mentioned networks may be controlled locally by a microprocessor based digital control module 120. Digital control signals from the microprocessor controller 120 are latched at appropriate analog modules of the electronic compensation network by means of latches 122. The networks may also be remotely controlled via a IEEE-488 bus that communicates with a local IEEE-488 module 124 and the digital control module 120. The filter integrated circuits are automatically offset by an automatic null means 126.

The electronic compensation network of the present invention may be operated at the site of the system for which compensation is desired. For example, if a robot arm, on an automotive assembly line, is responding to control systems in an undesirable manner, the device of the present invention may be used to remedy the situation.

Referring to FIG. 2, the electronic compensation network of the present invention may be hooked up so that the feedback signal of the system is directly input into system input 60 and output at system output 106. Referring to FIG. 1b, the electronic compensation network may be interposed directly in a feedback loop just as the compensator $G_c(s)$ is placed in the feedback loop of FIG. 1b.

The technician or operator investigating the system may then choose the appropriate compensation needed to correct the system response. For example, the technician may decide that the analytical function produced by the low pass filter is alone needed to compensate the robot system. In this case, the technician checks to make sure that bypass switches 84, 86, 88, 94 and 100 are in the position labeled out. Next, the technician switches bypass switch 70 into the filter in position. At this point, the low pass frequency selector and indicator 64 may be adjusted so that the appropriate filter frequency characteristics may be selected. Additionally, the low pass damping ratio indicator and selector 66 may be adjusted to select the appropriate damping ratio. Depending on the compensation desired, either the second order low pass filter or the fourth order low pass filter may be selected by positioning the low pass order selector and indicator 68 in either the second or fourth position. The technician may also adjust the gain of the signal before it is filtered by adjusting the input gain course adjustment knob 32 and input gain fine adjustment knob 34. The signal may also be inverted before it is filtered by use of the signal inversion means 36.

After the signal has been filtered, the output gain may be adjusted by adjusting course output gain adjustment means 50 and fine output gain adjustment means 52. A compensated signal is then output from the compensation network at output 106.

Referring to FIG. 11, the fundamentals of the operation of a second embodiment of the invention will now be described.

The signal from the feedback loop is input into the electronic compensation network at $V_{in}$ or input 108 and a compensated signal is output from the electronic compensation network at $V_{out}$ or output 110. A technician using controller or control means C may select the appropriate filter to be employed or combination of filters to be employed by keying in the appropriate commands. Next, the technician may key in through the controller C the appropriate parameters and filter characteristics desired. For example, if a second order low pass filter is desired, the technician may input the appropriate commands into the controller so that a second order low pass filter is in an active position within the electronic compensation network. Additionally, the controller may input the appropriate commands so that all other filter networks are bypassed. As in the example above for the first embodiment of the invention, the appropriate filter parameters and compensation characteristics may be selected and an indication of the parameters and characteristics selected may be indicated by indication means I.

Digital indicator I may be of any known type. For example, digital indicator I may be a simple digital display, such as a LED display or LCD display. Alternatively, the digital display may be a readout on a display screen such as a cathode ray tube display screen. Further, the indicator may also be in the form of a paper printout or the like.

The device of the present invention, because of the indicator and adjustment relationship, affords the opportunity to augment a feedback signal by compensating the signal. As the signal is being compensated, a person using the device, or a computer controlling the device, has immediate and simultaneous access to the reading indicative of the nature and particular characteristics of the adjustment made. This permits the user to have accurate information readily available to him as adjustments are made. Also, the user has the opportunity to realize instantaneously the change in compensation applied as a function of the change in the compensation setting.

While this invention has been described as having a preferred design, it is understood that it is capable of further modification, uses and/or adaptations of the invention following in general the principle of the invention and including such departures from the present disclosure as come within known or customary practice in the art to which the invention pertains, and as may be applied to the essential features set forth, and fall within the scope of the invention of the limits of the appended claims.

What is claimed is:

1. An electronic compensation network, comprising:
   (a) active switched-capacitor filter means;
   (b) control means operably associated with said filter means for selectively changing filter parameters and selecting compensator characteristics;
   (c) indicator means operably associated with said control means for providing an accurate reading of the filter parameters and compensation characteristics selected so that adjustment of compensator characteristics are simultaneously indicated by said indicator means;
   (d) input means operably associated with said filter means for input of a signal;
   (e) output means operably associated with said filter means for output of a compensation signal; and,
   (f) said active switched-capacitor filter means comprising active low pass filter means operably connected to said input means, an active switched-capacitor notch filter means operably connected to said low pass filter means, an active switched-capacitor lag-lead filter means operably connected to said notch filter means, and an active switched-capacitor lead-lag filter means operably connected to said lag-lead filter means.

2. An electronic compensation network according to claim 1, wherein said control means comprises:
   (a) means for selectively changing the damping ratio of said low pass filter means and said notch filter means; and,
   (b) bypass control means for selective individual bypass of each said filter.

3. An electronic compensation network according to claim 2, further comprising:
   (a) means for adjusting the input gain;
   (b) means for adjusting the output gain; and,
   (c) means for inverting a signal which is input.

4. An electronic compensation network according to claim 3, wherein said control means includes:
   (a) means for selecting a ratio between a second and a first lead-lag filter frequency characteristic;
   (b) means for selecting a first lag-lead filter frequency characteristic; and,
   (c) means for selecting a second lag-lead frequency characteristic.

5. An electronic compensation network according to claim 4, wherein said active switched-capacitor notch filter means comprises:
   (a) a first active notch filter having adjustable notch filter characteristics;
   (b) a second active switched-capacitor notch filter having adjustable notch filter characteristics; and,
   (c) a third active switched-capacitor notch filter having adjustable notch filter characteristics.

6. An electronic compensation network according to claim 4, wherein said low pass filter means includes:
   (a) a second order low pass filter and a fourth order low pass filter; and,
   (b) means for selecting either said second order low pass filter or said fourth order low pass filter.

7. A system for obtaining optimum response in a closed feedback loop, comprising;
   (a) input means for receiving a signal representative of a closed feedback loop system response;
   (b) input gain means operably connected to said input means;
   (c) active switched-capacitor low pass filter means operably connected to said input means;
   (d) active switched-capacitor notch filter means operably connected to said low pass filter means;
   (e) active switched-capacitor lag-lead filter means operably connected to said notch filter means;
   (f) active switched-capacitor lead-lag filter means operably connected to said lag-lead filter means;
   (g) output gain means operably connected to said lead-lag filter means;
   (h) output means operably connected to said output gain means for outputting a compensated signal;
   (i) control means operably associated with each of said filter means for selectively adjusting operating characteristics of each of said filters; and,
   (j) indicator means operably associated with said control means for indicating the selected filter value for each of said filter means.

8. A system according to claim 7, further comprising:
   (a) bypass control means operably associated with each of said filter means for permitting selective individual bypass of each said filter.

9. A system according to claim 8, wherein said control means comprises:
   (a) means for adjusting a frequency characteristics of said low pass filter;
   (b) means for adjusting a frequency characteristic of said notch filter;
   (c) means for adjusting a first frequency characteristic of said lead-lag filter;
   (d) means for adjusting the ratio of a second frequency characteristic of said lead-lag filter to said first frequency characteristic of said lead-lag filter;
   (e) means for adjusting a first frequency characteristic of said lag-lead filter; and,
   (f) means for adjusting a second frequency characteristic of said lag-lead filter.

10. A system according to claim 8, wherein said control means comprises:
    (a) means for adjusting the damping ratio of said low pass filter means; and,
    (b) means for adjusting the damping ratio of said notch filter means.

11. A system according to claim 8, wherein said control comprises:
    (a) means for selecting between a low pass filter producing a second order function and a low pass filter producing a fourth order function.

* * * * *